United States Patent
Hongo et al.

(10) Patent No.: US 7,440,256 B2
(45) Date of Patent: Oct. 21, 2008

(54) LAMINATED CERAMIC SUBSTRATE AND MANUFACTURING METHOD THEREFOR

(75) Inventors: Masanori Hongo, Osaka (JP); Hiroyuki Nishikiori, Hyogo (JP); Natsuyo Nagano, Osaka (JP); Takashi Ogura, Kyoto (JP)

(73) Assignee: Sanyo Electric Co., Ltd., Moriguchi-Shi (JP)

( * ) Notice: Subject to any disclaimer, the term of this patent is extended or adjusted under 35 U.S.C. 154(b) by 5 days.

(21) Appl. No.: 10/541,494

(22) PCT Filed: Sep. 27, 2004

(86) PCT No.: PCT/JP2004/014551

§ 371 (c)(1),
(2), (4) Date: Jul. 7, 2005

(87) PCT Pub. No.: WO2005/034592

PCT Pub. Date: Apr. 14, 2005

(65) Prior Publication Data

US 2006/0115637 A1 Jun. 1, 2006

(30) Foreign Application Priority Data

Oct. 6, 2003 (JP) .................. 2003-347435

(51) Int. Cl.
*H01G 2/20* (2006.01)
*H01G 4/228* (2006.01)

(52) U.S. Cl. .............. 361/306.1; 361/306.3; 361/308.1; 361/309; 428/192

(58) Field of Classification Search ................ 428/210, 428/192; 361/306.3, 308.1, 309
See application file for complete search history.

(56) References Cited

U.S. PATENT DOCUMENTS

| 3,612,963 | A | * | 10/1971 | Piper et al. ................ 361/321.3 |
| 4,821,007 | A | * | 4/1989 | Fields et al. ................ 333/238 |
| 4,907,128 | A | * | 3/1990 | Solomon et al. ............ 361/736 |
| 5,140,745 | A | * | 8/1992 | McKenzie, Jr. .............. 29/852 |
| 5,258,648 | A | * | 11/1993 | Lin ........................... 257/778 |
| 5,512,353 | A | * | 4/1996 | Yokotani et al. ............ 428/210 |
| 5,621,193 | A | * | 4/1997 | Isaak ......................... 174/262 |
| 5,785,879 | A | * | 7/1998 | Kawamura et al. ........... 216/95 |
| 6,958,899 | B2 | * | 10/2005 | Togashi et al. .............. 361/303 |

(Continued)

FOREIGN PATENT DOCUMENTS

JP 3-85793 4/1991

(Continued)

*Primary Examiner*—Cathy F. Lam
(74) *Attorney, Agent, or Firm*—Kratz, Quintos & Hanson, LLP (57) ABSTRACT

A laminated ceramic substrate includes a side electrode in which a side edge electrode layer formed on a side edge portion of a ceramic layer overlaps with and connects to a side edge electrode layer formed on a side edge portion of another ceramic layer directly above and/or directly below the former ceramic layer. The side edge electrode layer includes a parallel wall unexposed and approximately parallel to a side surface of the laminated ceramic substrate and a perpendicular wall approximately perpendicular to the side surface of the laminated ceramic substrate. A length La of the parallel wall and a depth Lb of the parallel wall from the side surface of the laminated ceramic substrate have a relationship of La>Lb.

6 Claims, 11 Drawing Sheets

U.S. PATENT DOCUMENTS

| | | |
|---|---|---|
| 2003/0000079 A1 | 1/2003 | Harada et al. |
| 2003/0128526 A1 | 7/2003 | Sakai et al. |

FOREIGN PATENT DOCUMENTS

| | | |
|---|---|---|
| JP | 9-83090 | 3/1997 |
| JP | 3336913 | 1/1999 |
| JP | 2002-232135 | 8/2002 |
| JP | 2003-17851 | 1/2003 |
| JP | 2003-258398 | 9/2003 |

* cited by examiner

LAMINATED CERAMIC SUBSTRATE AND MANUFACTURING METHOD THEREFOR

TECHNICAL FIELD

The present invention relates to a laminated ceramic substrate for constituting various electronic circuits provided in electronic devices such as portable telephones, and to a manufacturing method therefor.

BACKGROUND ART

Conventionally, in a small electronic device such as a portable telephone, it has been carried into practice that a plurality of circuit elements constituting, the device are integrated in one-chip laminated ceramic component and the laminated ceramic component is mounted on a main substrate (Patent Document 1, for example).

Figure 11:
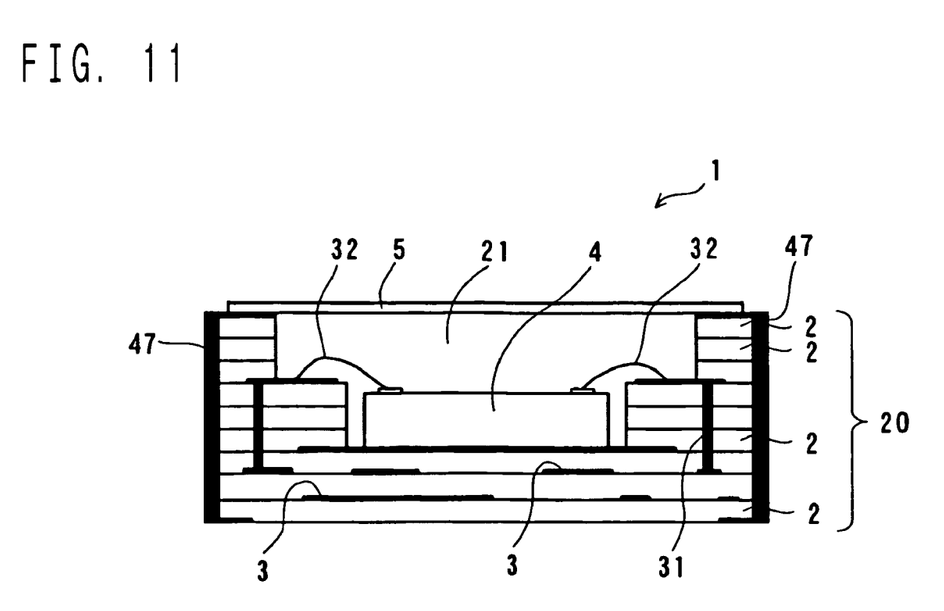
FIG. 11 is a sectional view of a laminated ceramic component using a laminated ceramic substrate of the present invention and a conventional example.

FIG. 11 illustrates a laminate structure of a laminated ceramic component 1, in which a plurality of ceramic layers 2 are laminated to constitute a laminated ceramic substrate 20. Formed on each surface of the ceramic layers 2 are a plurality of circuit element patterns 3 constituting an inductor or a capacitor. These circuit element patterns 3 are connected to each other by a vertical conduction path (hereinafter referred to as a via hole) 31 formed by penetrating the ceramic layers 2. A side electrode 47 is provided on a side surface of the laminated ceramic substrate 20 and connected to the circuit element patterns 3.

A cavity 21 is provided on a surface of the laminated ceramic substrate 20. An electronic component 4 such as a surface acoustic wave filter is mounted on a bottom surface of the cavity 21. The electronic component 4 is connected to the circuit element patterns 3 through a bonding wire 32.

A lid 5 covering the cavity 21 is placed on the surface of the laminated ceramic substrate 20 to constitute the laminated ceramic component 1 packaged.

The above-described laminated ceramic substrate 20 is manufactured by the steps shown in FIG. 10.

First, as shown in FIG. 10(*a*), a green sheet 25 including a ceramic mixed material is prepared. Next, as shown in FIG. 10(*b*), a through hole 22 for a cavity, a through hole for a via hole (not shown), and a circular-shaped through hole 23 for a side electrode are provided at desired locations of the green sheet 25. Thereafter, as shown in FIG. 10(*c*), the through hole for a via hole and the through hole 23 for a side electrode are filled with a conductive material 24. Subsequently, as shown in FIG. 10(*d*), the conductive material 24 is printed on a surface of the green sheet 25 to form a circuit element pattern 30.

Green sheets 25 thus obtained are laminated and thereafter integrated by heat press or other methods to prepare a green-sheet laminated body 26 shown in FIG. 10(*e*).

Thereafter, as shown in FIG. 10(*f*), the green-sheet laminated body 26 is divided for each cavity 21 to obtain a plurality of green-sheet laminated body chips 27. Then, as shown in FIG. 10(*g*), each of the green-sheet laminated body chips 27 is fired to obtain the laminated ceramic substrate 20.

As shown in FIG. 11, the electronic component 4 is mounted on the bottom surface of the cavity 21 of the laminated ceramic substrate 20 thus obtained. Then wire bonding is applied thereto and the lid 5 is placed to thereby complete the laminated ceramic component 1.

[Patent Document 1] U.S. Pat. No. 3,336,913, FIG. 6(*b*)

Figure 4A:
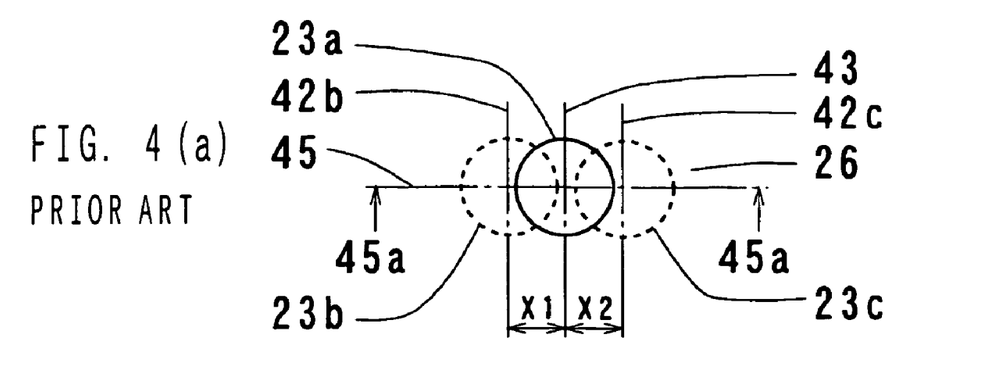
FIG. 4 illustrates one step of a laminated ceramic substrate of a conventional example.

A conventional laminated ceramic substrate includes a semicircular side electrode in which a side edge electrode layer formed on a side edge portion of a ceramic layer overlaps with and connects to a side edge electrode layer formed on a side edge portion of another ceramic layer directly above and/or directly below the former ceramic layer. This can be obtained because a circular-shaped through hole for a side electrode is filled with a conductive material and thereafter divided. FIG. 4(*a*) is a partial top view in the vicinity of a circular-shaped through hole 23 for a side electrode of a conventional green-sheet laminated body 26. Through holes 23*a*, 23*b*, and 23*c* for a side electrode each have the same shape. For example, a green sheet 25*a* is disposed on a designed center in a side-electrode width direction and on a designed center in a side-electrode depth direction with a green sheet 25*b* laminated thereon shifted from the designed center in the side-electrode width direction to the left in the drawing by X1 greater than the radius of the through hole for a side electrode and a green sheet 25*c* further laminated thereon shifted from the designed center in the side-electrode width direction to the right in the drawing by X2 greater than the radius of the through hole for a side electrode. The green sheets 25*b* and 25*c* are both disposed on the designed center in the side-electrode depth direction. A width direction center of the through hole 23*a* for a side electrode of the green sheet 25*a* is the same as the designed center 43 in the side-electrode width direction. In contrast, a width direction center 42*b* of the through hole 23*b* for a side electrode of the green sheet 25*b* is shifted from the designed center 43 in the side-electrode width direction to the left in the drawing by the shift amount X1. A width direction center 42*c* of the through hole 23*c* for a side electrode of the green sheet 25*c* is also shifted from the designed center 43 in the side-electrode width direction to the right in the drawing by the shift amount X2.

Figure 4B:
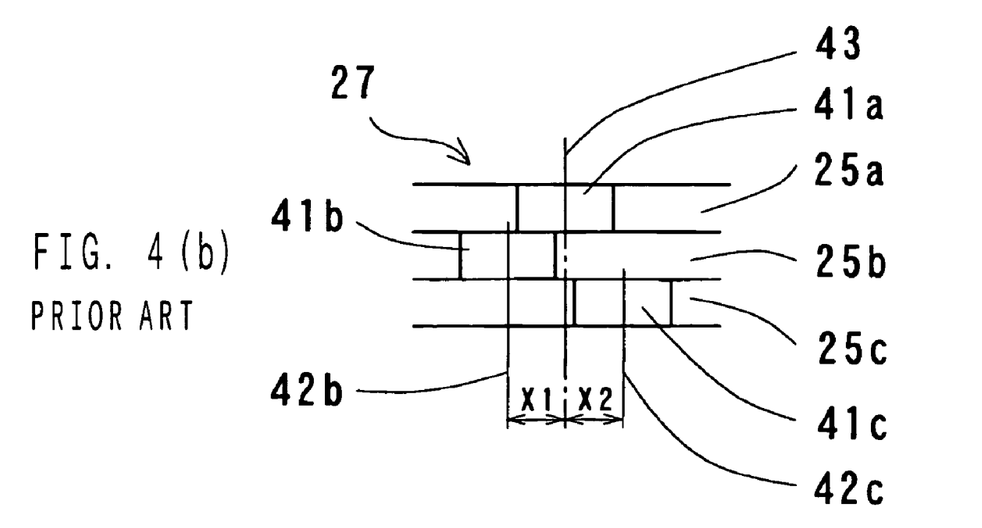

FIG. 4(*b*) is a partial side view in the vicinity of a side electrode of a green-sheet laminated body chip 27 obtained by dividing the green-sheet laminated body 26 along a line 45*a*-45*a* (same as the designed center 45 in the side-electrode depth direction). As seen in the drawing, side edge electrode layers 41*a*, 41*b*, and 41*c* that must essentially be electrically connected are disconnected at a border between the neighboring side edge electrode layers 41*b* and 41*c* of the green sheets 25*b* and 25*c*, respectively, resulting in a laminated ceramic substrate with a disconnection defect.

Figure 6A:
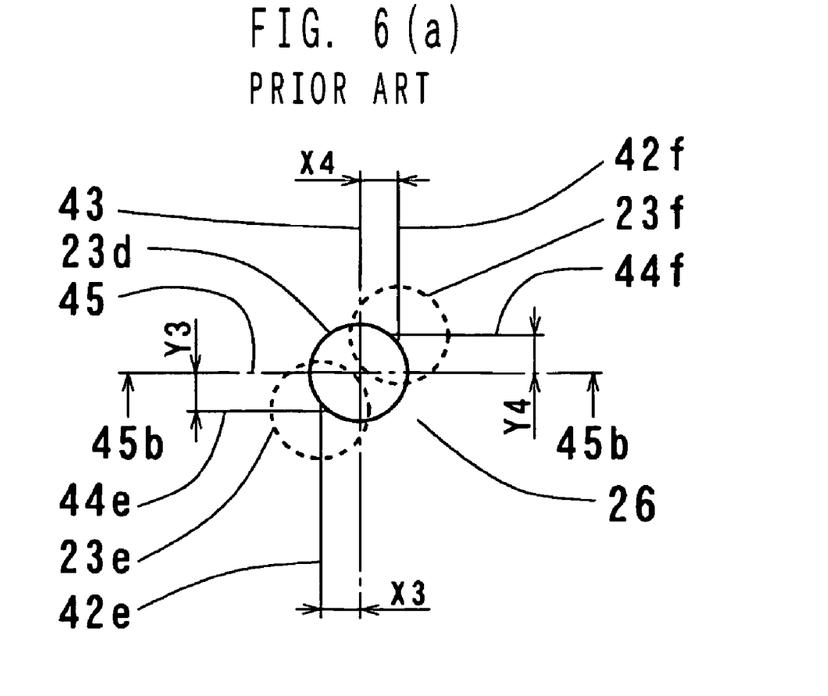
FIG. 6 illustrates one step of a laminated ceramic substrate of a conventional example.

FIG. 6(*a*) is a partial top view in the vicinity of a circular-shaped through hole 23 for a side electrode of a conventional green-sheet laminated body 26. Through holes 23*d*, 23*e*, and 23*f* for a side electrode each have the same shape. For example, a green sheet 25*d* is disposed on a designed center in a side-electrode width direction and on a designed center in a side-electrode depth direction with a green sheet 25*e* laminated thereon shifted from the designed center in the side-electrode depth direction to the bottom in the drawing by Y3 smaller than the radius of the through hole for a side electrode and shifted from the designed center in the side-electrode width direction to the left in the drawing by X3 smaller than the radius of the through hole for a side electrode, and with a green sheet 25*f* further laminated thereon shifted from the designed center in the side-electrode depth direction to the top in the drawing by Y4 smaller than the radius of the through hole for a side electrode and shifted from the designed center in the side-electrode width direction to the right in the drawing by X4 smaller than the radius of the through hole for a side electrode. A depth direction center and a width direction center of the through hole 23*d* for a side electrode of the green sheet 25*d* are the same as the designed center 45 in the side-electrode depth direction and the designed center 43 in the side-electrode width direction, respectively. In contrast, a depth direction center 44*e* of the through hole 23*e* for a side electrode of the green sheet 25*e* is shifted from the designed center 45 in the side-electrode depth direction to the bottom in the drawing by the shift amount Y3 and a width direction center 42e of the through hole 23e for a side electrode of the green sheet 25e is shifted from the designed center 43 in the side-electrode width direction to the left in the drawing by the shift amount X3. A depth direction center 44f of the through hole 23f for a side electrode of the green sheet 25f is also shifted from the designed center 45 in the side-electrode depth direction to the top in the drawing by the shift amount Y4 and a width direction center 42f of the through hole 23f for a side electrode of the green sheet 25f is also shifted from the designed center 43 in the side-electrode width direction to the right in the drawing by the shift amount X4.

Figure 6B:
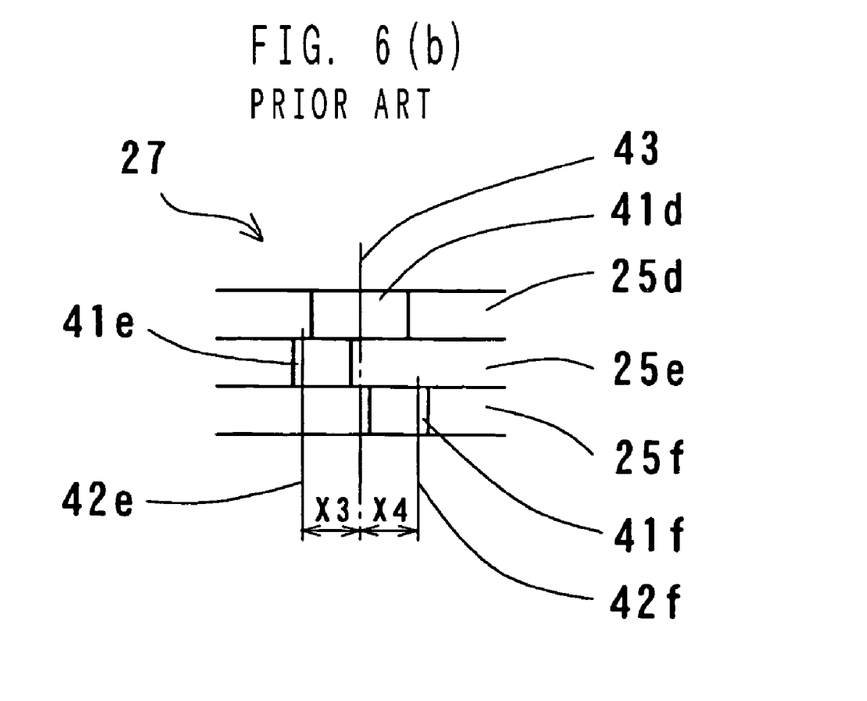

FIG. 6(b) is a partial side view in the vicinity of a side electrode of a green-sheet laminated body chip 27 obtained by dividing the green-sheet laminated body 26 along a line 45b-45b (same as the designed center 45 in the side-electrode depth direction). As seen in the drawing, even if each of the shift amounts Y3 and Y4 in the depth direction and each of the shift amounts X3 and X4 in the width direction of the green sheets 25e and 25f are both smaller than the radius of the side electrode, side edge electrode layers 41d, 41e, and 41f that must essentially be electrically connected are disconnected at a border between the neighboring side edge electrode layers 41e and 41f of the green sheets 25e and 25f, respectively, resulting in a laminated ceramic substrate with a disconnection defect.

Figure 8A:
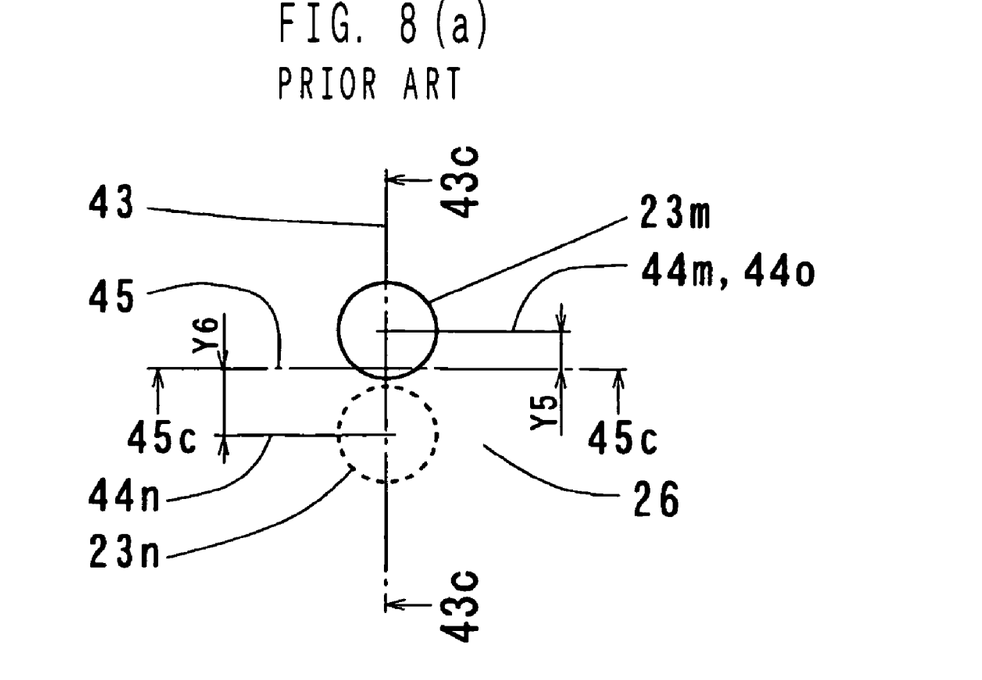
FIG. 8 illustrates one step of a laminated ceramic substrate of a conventional example.

FIG. 8(a) is a partial top view in the vicinity of a circular-shaped through hole 23 for a side electrode of a conventional green-sheet laminated body 26. Through holes 23m, 23n, and 23o for a side electrode each have the same shape. For example, green sheets 25m and 25o are shifted from a designed center in a side-electrode depth direction to the top in the drawing by Y5 smaller than the radius of the through hole for a side electrode with a green sheet 25n laminated thereon shifted from the designed center in the side-electrode depth direction to the bottom in the drawing by Y6 greater than the radius of the through hole for a side electrode. The green sheets 25m, 25n, and 25o are all disposed on the designed center in the side-electrode width direction. Depth direction centers 44m and 44o of the through holes 23m and 23o for a side electrode of the green sheets 25m and 25o are shifted from the designed center 45 in the side electrode-depth direction to the top in the drawing by the shift amount Y5. A depth direction center 44n of the through hole 23n for a side electrode of the green sheet 25n is also shifted from the designed center 45 in the side-electrode depth direction to the bottom in the drawing by the shift amount Y6.

Figure 8B:
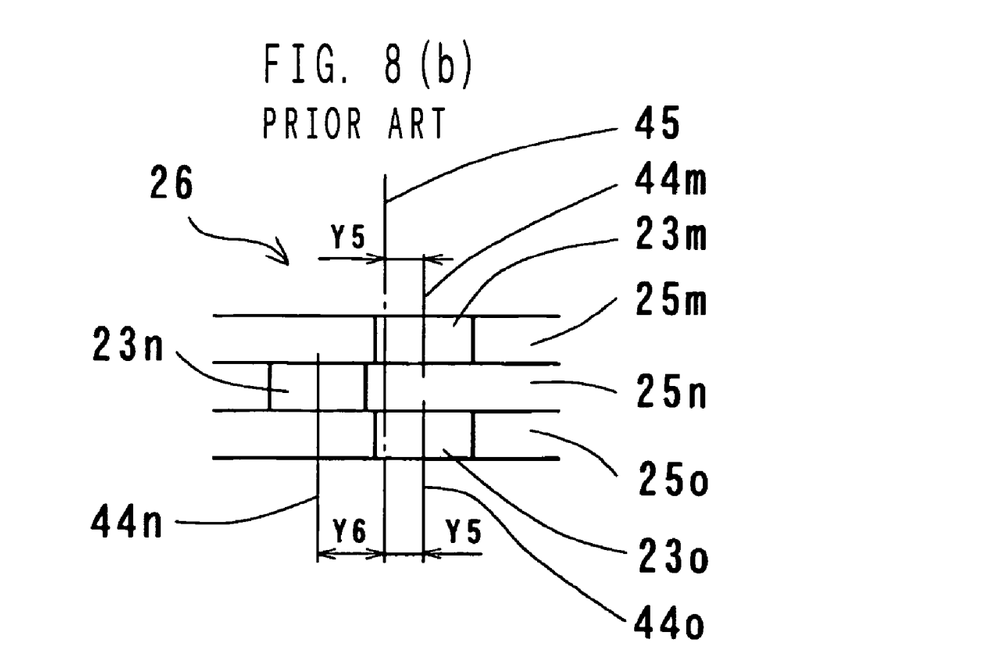

FIG. 8(b) is a partial sectional view in the vicinity of a side electrode in which the green-sheet laminated body 26 is divided along a line 43c-43c (same as the designed center 43 in the side-electrode width direction). As seen in the drawing, the through holes 23m, 23n, and 23o for a side electrode that must essentially be electrically connected are disconnected at a border between the neighboring through holes 23m and 23n for a side electrode of the green sheets 25m and 25n, respectively, and at a border between the neighboring through holes 23n and 23o for a side electrode of the green sheets 25n and 25o, respectively. A side electrode of a green-sheet laminated body chip 27 obtained by dividing the green-sheet laminated body 26 along a line 45c-45c (same as the designed center 45 in the side-electrode depth direction) is to be disconnected, resulting in a laminated ceramic substrate with a disconnection defect.

As described above, there has been a problem that a disconnection defect caused by lamination shift may reduce production yield of a laminated ceramic substrate 20.

Accordingly, an object of the present invention is to provide a laminated ceramic substrate and a manufacturing method therefor in which occurrences of a disconnection defect of a laminated ceramic substrate 20 caused by green sheet lamination shift are reduced.

DISCLOSURE OF THE INVENTION

The side edge electrode layer includes a parallel wall unexposed and approximately parallel to a side surface of the laminated ceramic substrate and a perpendicular wall approximately perpendicular to the side surface of the laminated ceramic substrate. A length La of the parallel wall and a depth Lb of the parallel wall from the side surface of the laminated ceramic substrate have a relationship of La>Lb. A manufacturing method includes a step shown in FIG. 10(b) of providing a through hole for a via hole and a through hole 23 for a side electrode at desired locations of a green sheet 25, in which the through hole 23 for a side electrode has at least four straight-line portions as shown in FIG. 3(a).

Figure 3A:
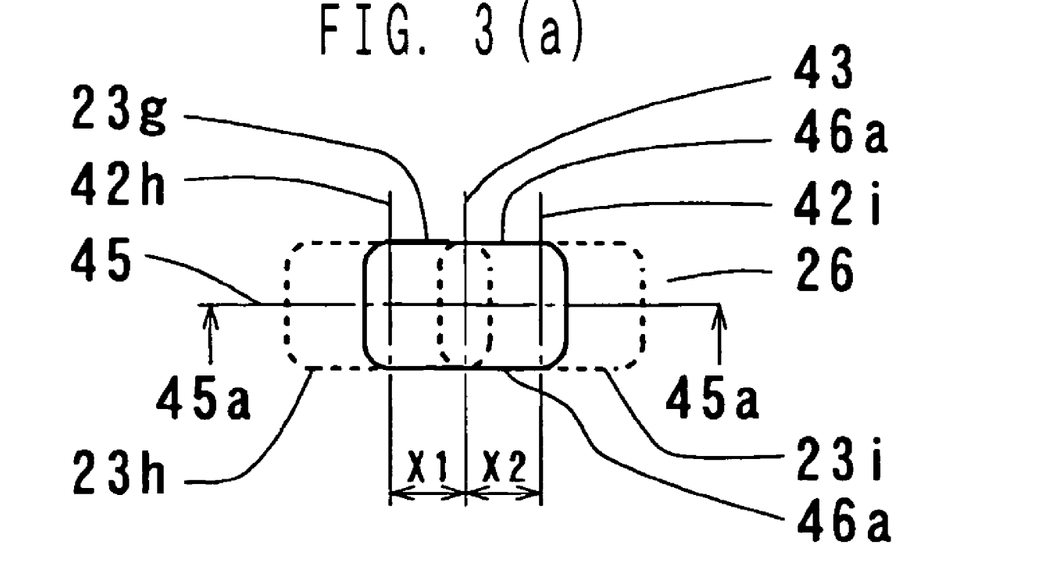
FIG. 3 illustrates one step of a laminated ceramic substrate of the present invention.

FIG. 3(a) is a partial top view in the vicinity of a through hole 23 for a side electrode of a green-sheet laminated body 26 of the present invention. Through holes 23g, 23h, and 23i for a side electrode each have the same shape, and a depth direction dimension thereof (dimension between 46a-46a) is equal to the diameter of the circular-shaped through hole for a side electrode in FIG. 4. A length of two opposite flat walls 46a of the through hole for a side electrode is greater than ½ of the dimension between the flat walls 46a-46a. Each of shift amounts of three green sheets from a designed center in a side-electrode width direction and from a designed center in a side-electrode depth direction is also exactly the same as that in FIG. 4. That is, a green sheet 25g is disposed on the designed center in the side-electrode width direction and on the designed center in the side-electrode depth direction with a green sheet 25h laminated thereon shifted from the designed center in the side-electrode width direction to the left in the drawing by X1 greater than ½ of the depth of the through hole for a side electrode and a green sheet 25i further laminated thereon shifted from the designed center in the side-electrode width direction to the right in the drawing by X2 greater than ½ of the depth of the through hole for a side electrode. The green sheets 25h and 25i are both disposed on the designed center in the side-electrode depth direction. A width direction center of the through hole 23g for a side electrode of the green sheet 25g is the same as the designed center 43 in the side-electrode width direction. In contrast, a width direction center 42h of the through hole 23h for a side electrode of the green sheet 25h is shifted from the designed center 43 in the side-electrode width direction to the left in the drawing by the shift amount X1. A width direction center 42i of the through hole 23i for a side electrode of the green sheet 25i is also shifted from the designed center 43 in the side-electrode width direction to the right in the drawing by the shift amount X2.

Figure 3B:
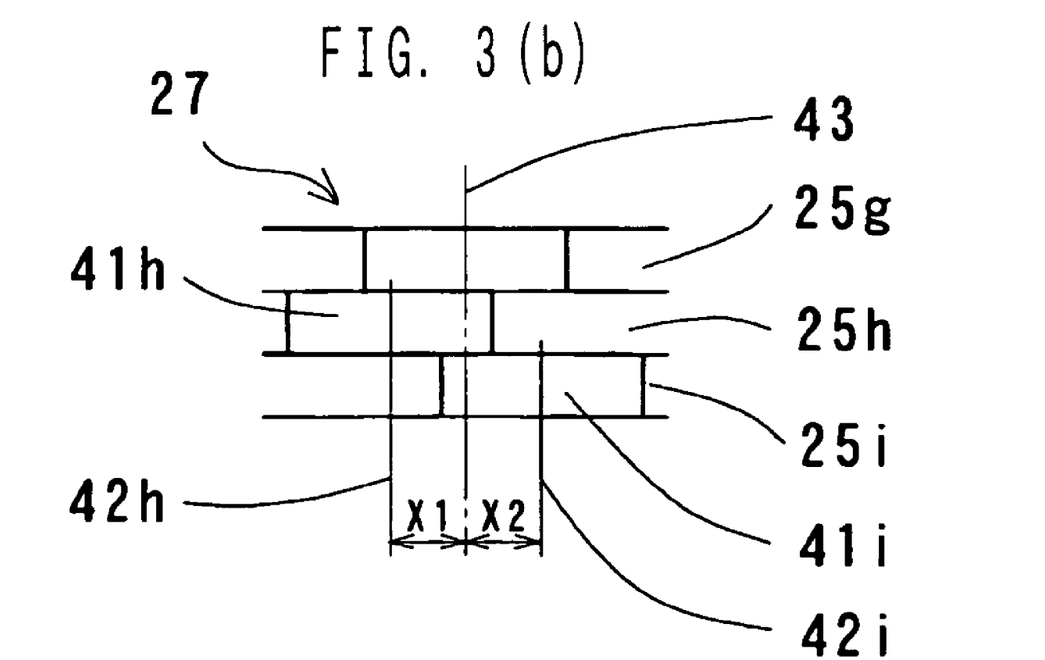

FIG. 3(b) is a partial side view in the vicinity of a side electrode of a green-sheet laminated body chip 27 obtained by dividing the green-sheet laminated body 26 along a line 45a-45a (same as the designed center 45 in the side-electrode depth direction). As seen in the drawing, neighboring side edge electrode layers 41h and 41i of the green sheets 25h and 25i, respectively, partially overlap to prevent the disconnection at the border found conventionally, free from a disconnection defect.

Figure 5A:
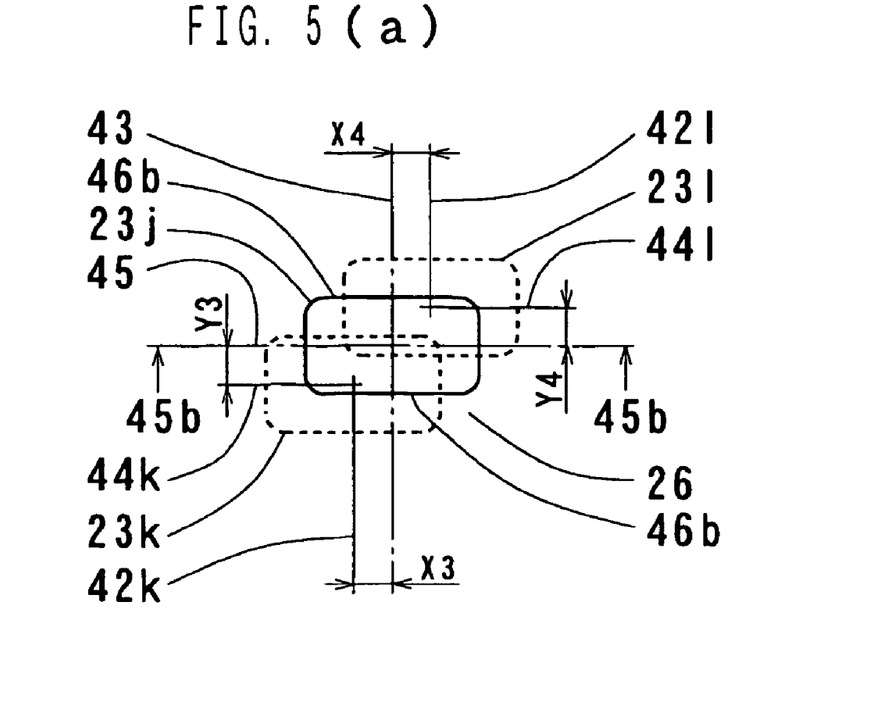
FIG. 5 illustrates one step of a laminated ceramic substrate of the present invention.

FIG. 5(a) is a partial top view in the vicinity of a through hole 23 for a side electrode of a green-sheet laminated body 26 of the present invention. Through holes 23j, 23k, and 23l for a side electrode each have the same shape, and a depth direction dimension thereof (dimension between 46b-46b) is equal to the diameter of the circular-shaped through hole for a side electrode in FIG. 6. A length of two opposite flat walls 46b of the through hole for a side electrode is greater than ½ of the dimension between the flat walls 46b-46b. Each of shift amounts of three green sheets from a designed center in a side-electrode width direction and from a designed center in a side-electrode depth direction is also exactly the same as that in FIG. 6. That is, a green sheet 25j is disposed on the designed center in the side-electrode width direction and on the designed center in the side-electrode depth direction with a green sheet 25k laminated thereon shifted from the designed center in the side-electrode depth direction to the bottom in the drawing by Y3 smaller than ½ of the depth of the through hole for a side electrode and shifted from the designed center in the side-electrode width direction to the left in the drawing by X3 smaller than ½ of the depth of the through hole for a side electrode, and with a green sheet 25l further laminated thereon shifted from the designed center in the side-electrode depth direction to the top in the drawing by Y4 smaller than ½ of the depth of the through hole for a side electrode and shifted from the designed center in the side-electrode width direction to the right in the drawing by X4 smaller than ½ of the depth of the through hole for a side electrode. A depth direction center and a width direction center of the through hole 23j for a side electrode of the green sheet 25j are the same as the designed center 45 in the side-electrode depth direction and the designed center 43 in the side-electrode width direction, respectively. In contrast, a depth direction center 44k of the through hole 23k for a side electrode of the green sheet 25k is shifted from the designed center 45 in the side-electrode depth direction to the bottom in the drawing by the shift amount Y3 and a width direction center 42k of the through hole 23k for a side electrode of the green sheet 25k is shifted from the designed center 43 in the side-electrode width direction to the left in the drawing by the shift amount X3. A depth direction center 44l of the through hole 23l for a side electrode of the green sheet 25l is also shifted from the designed center 45 in the side-electrode depth direction to the top in the drawing by the shift amount Y4 and a width direction center 42l of the through hole 23l for a side electrode of the green sheet 25l is also shifted from the designed center 43 in the side-electrode width direction to the right in the drawing by the shift amount X4.

Figure 5B:
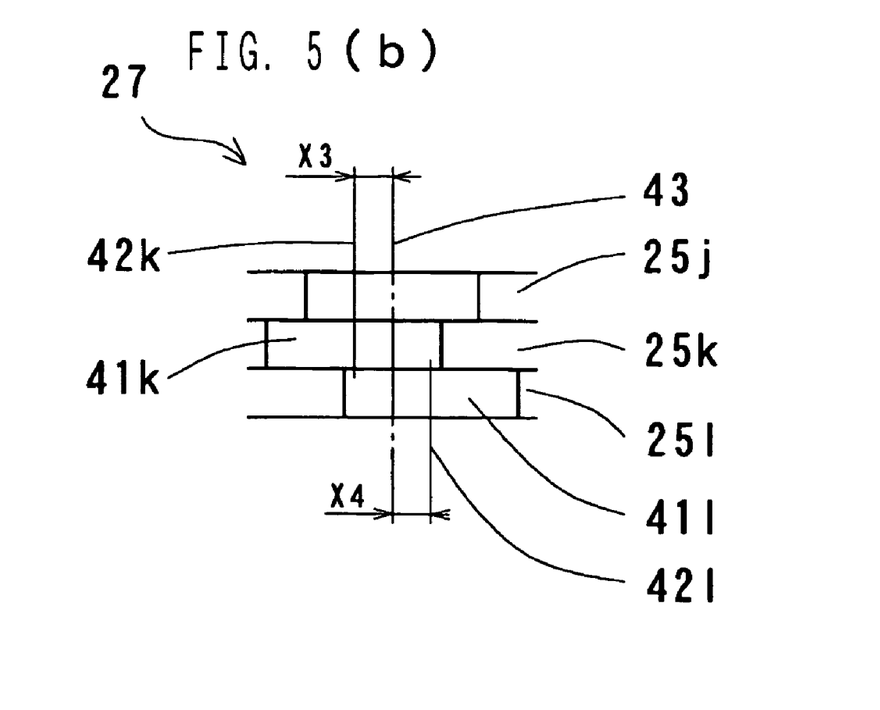

FIG. 5(b) is a partial side view in the vicinity of a side electrode of a green-sheet laminated body chip 27 obtained by dividing the green-sheet laminated body 26 along a line 45b-45b (same as the designed center 45 in the side-electrode depth direction). As seen in the drawing, neighboring side edge electrode layers 41k and 41l of the green sheets 25k and 25l, respectively, partially overlap to prevent the disconnection at the border found conventionally, free from a disconnection defect.

Figure 7A:
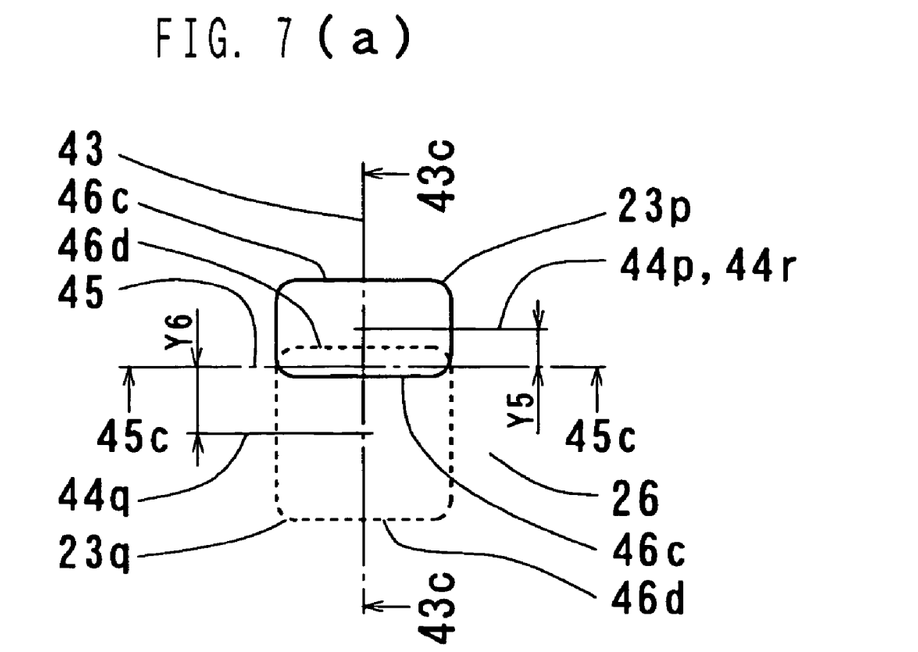
FIG. 7 illustrates one step of a laminated ceramic substrate of the present invention.

FIG. 7(a) is a partial top view in the vicinity of a through hole 23 for a side electrode of a green-sheet laminated body 26 of the present invention. Through holes 23p and 23r for a side electrode each have the same shape, and a depth direction dimension thereof (dimension between 46c-46c) is equal to the diameter of the circular-shaped through hole for a side electrode in FIG. 8. A depth direction dimension of a through hole 23q for a side electrode (dimension between 46d-46d) is greater than the diameter of the circular-shaped through hole for a side electrode in FIG. 8. A length of two opposite flat walls 46c of each of the through holes 23p and 23r for a side electrode is greater than ½ of the dimension between the flat walls 46c-46c. A length of two opposite flat walls 46d of the through hole 23q for a side electrode is greater than ½ of the dimension between the flat walls 46d-46d. Each of shift amounts of three green sheets from a designed center in a side-electrode width direction and from a designed center in a side-electrode depth direction is also exactly the same as that in FIG. 8. That is, green sheets 25p and 25r are shifted from the designed center in the side-electrode depth direction to the top in the drawing by Y5 smaller than ½ of the depth of the through hole 23p for a side electrode with a green sheet 25q laminated thereon shifted from the designed center in the side-electrode depth direction to the bottom in the drawing by Y6 greater than ½ of the depth of the through hole 23p for a side electrode. The green sheets 25p, 25q, and 25r are all disposed on the designed center in the side-electrode width direction. Depth direction centers 44p and 44r of the through holes 23p and 23r for a side electrode of the green sheets 25p and 25r are shifted from the designed center 45 in the side-electrode depth direction to the top in the drawing by the shift amount Y5. A depth direction center 44q of the through hole 23q for a side electrode of the green sheet 25q is also shifted from the designed center 45 in the side-electrode depth direction to the bottom in the drawing by the shift amount Y6.

Figure 7B:
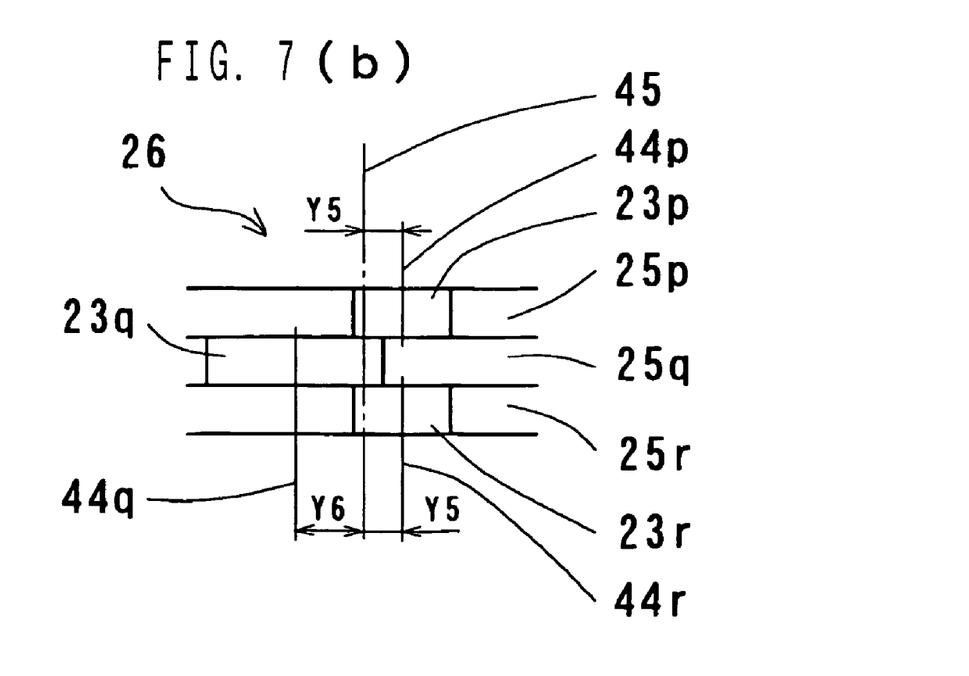

FIG. 7(b) is a partial sectional view in the vicinity of a side electrode in which the green-sheet laminated body 26 is divided along a line 43c-43c (same as the designed center 43 in the side-electrode width direction). As seen in the drawing, the neighboring through holes 23p and 23q for a side electrode of the green sheets 25p and 25q, respectively, and the neighboring through holes 23q and 23r for a side electrode of the green sheets 25q and 25r, respectively, each partially overlap. Thus, a side electrode of a green-sheet laminated body chip 27 obtained by dividing the green-sheet laminated body 26 along a line 45c-45c (same as the designed center 45 in the side-electrode depth direction) is prevented from disconnections at the borders, resulting in a laminated ceramic substrate free from a disconnection defect.

As described above, a side edge electrode layer including a parallel wall unexposed and approximately parallel to a side surface of a laminated ceramic substrate and a perpendicular wall approximately perpendicular to the side surface of the laminated ceramic substrate, in which a length La of the parallel wall and a depth Lb of the parallel wall from the side surface of the laminated ceramic substrate have a relationship of La>Lb, can decrease an occurrence rate of disconnections of a side electrode caused by lamination shift, and therefore can decrease disconnection defects of the laminated ceramic substrate to improve production yield of the laminated ceramic substrate.

Figure 9A:
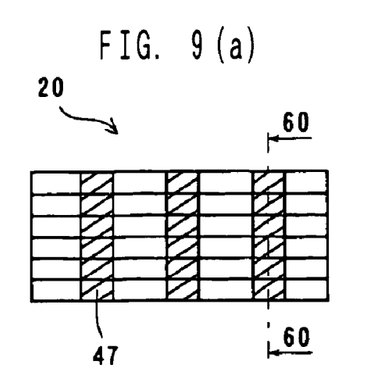
FIG. 9 includes a front view and schematic sectional views of a laminated ceramic substrate of the present invention.
Figure 9B:
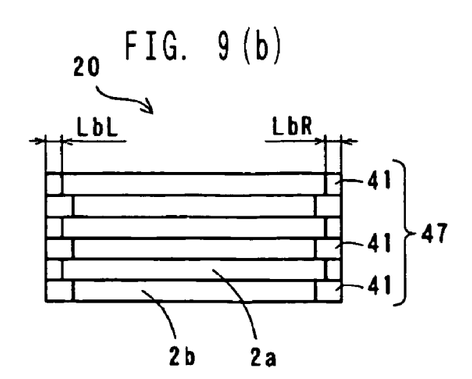
Figure 9C:
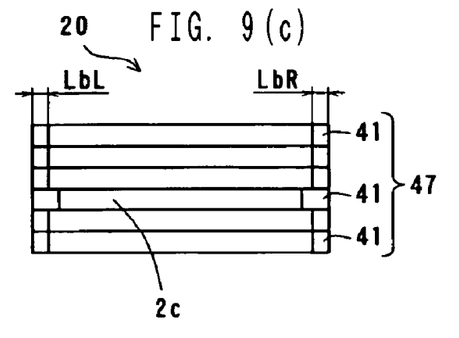
Figure 9D:
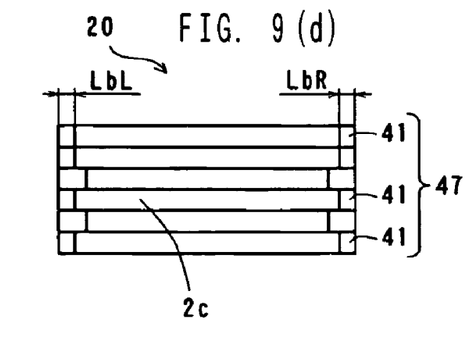

FIG. 9(a) is a front view of a laminated ceramic substrate 20. FIGS. 9(b) to (d) are schematic sectional views in which the laminated ceramic substrate 20 is divided along a line 60-60. A side edge electrode layer 47 is only shown for simplification of the drawings.

Odd number green sheets from the top layer provided with a through hole for a side electrode having a double depth of a depth Lb of the side edge electrode layer and even number green sheets from the top layer provided with a through hole for a side electrode having a greater depth than that of the through hole for a side electrode of the odd number green sheets are laminated alternately to complete the laminated ceramic substrate. FIG. 9(b) shows a cross section of the laminated ceramic substrate, in which ceramic layers 2a with a side edge electrode layer 41 having a smaller depth and ceramic layers 2b with a side edge electrode layer 41 having a greater depth are alternated from the top layer to the bottom layer, that is, a sum of depths of opposite side edge electrode layers 41 LbL+LbR partially differs with respect to a laminated direction. This can further decrease an occurrence rate of disconnections of a side electrode caused by lamination shift.

As shown in FIG. 9(c), a side edge electrode layer 41 having a greater depth may be provided only on a ceramic layer 2c formed with a green sheet that may easily cause lamination shift such as a thin green sheet or a green sheet having a large area GND pattern printed thereon. A side edge electrode layer 41 having a greater depth may also be provided only on a layer directly above and/or directly below the ceramic layer 2c as shown in FIG. 9(d).

The number and position of ceramic layers provided with a side edge electrode layer 41 having a greater depth are not limited, but preferably, the number of ceramic layers provided with a side edge electrode layer 41 having a greater depth is limited to a minimum necessary because a side edge electrode layer 41 with a greater depth makes narrower an area in which a circuit element pattern 3 is disposed on the ceramic layers.

BEST MODE FOR CARRYING OUT THE INVENTION

A description of embodiments of the present invention will be given below with reference to the drawings.

A laminated ceramic substrate 20 of the present invention is constituted by laminating a plurality of ceramic layers 2 as shown in FIG. 11. Formed on each surface of the ceramic layers 2 are a plurality of circuit element patterns 3 constituting an inductor or a capacitor. The circuit element patterns 3 are connected to each other by a via hole 31 formed by penetrating the ceramic layers 2. A side electrode 47 is provided on a side surface of the laminated ceramic substrate 20 and connected to the circuit element patterns 3. A cavity 21 is provided on a surface of the laminated ceramic substrate 20.

A laminated ceramic component 1 using the laminated ceramic substrate 20 has an electronic component 4 such as a surface acoustic wave filter mounted on a bottom surface of the cavity 21. The electronic component 4 is connected to the circuit element patterns 3 through a bonding wire 32. A lid 5 covering the cavity 21 is placed on the surface of the laminated ceramic substrate 20 to constitute the laminated ceramic component 1 packaged.

The above-described laminated ceramic substrate 20 is manufactured by the steps shown in FIG. 10.

Figure 10A:
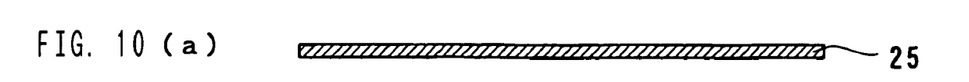
FIG. 10 illustrates a series of the steps of a laminated ceramic substrate of the present invention and a conventional example.
Figure 10B:
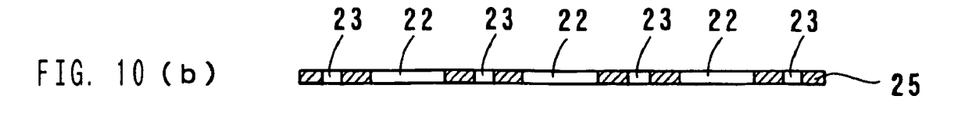
Figure 10C:
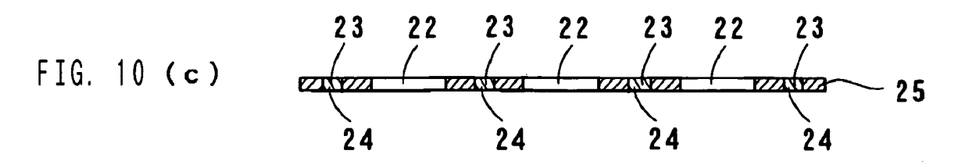
Figure 10D:
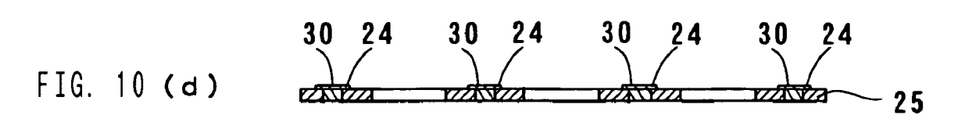
Figure 10E:
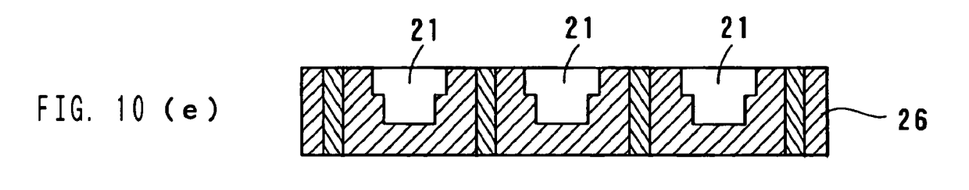

First, as shown in FIG. 10(a), a green sheet 25 including a ceramic mixed material is prepared. Next, as shown in FIG. 10(b), a through hole 2 for a cavity, a through hole for a via hole, and a through hole 23 for a side electrode are provided at desired locations of the green sheet 25.

The through hole for a via hole and the through hole 23 for a side electrode of a plurality of green sheets 25 thus obtained are filled with a conductive material 24.

Thereafter, a circuit element pattern 30 is printed on a surface of the plurality of green sheets 25 with the conductive material 24. The green sheets 25 thus obtained are laminated and integrated by heat press or other methods to prepare a green-sheet laminated body 26.

Figure 10F:
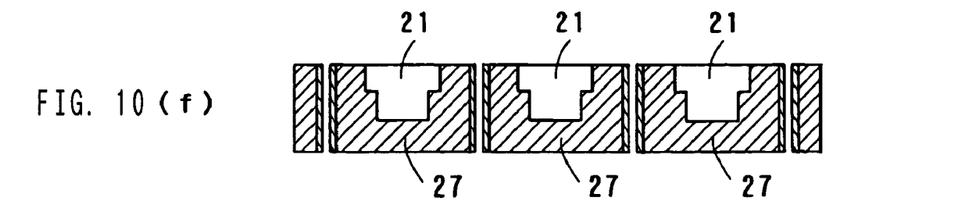
Figure 10G:
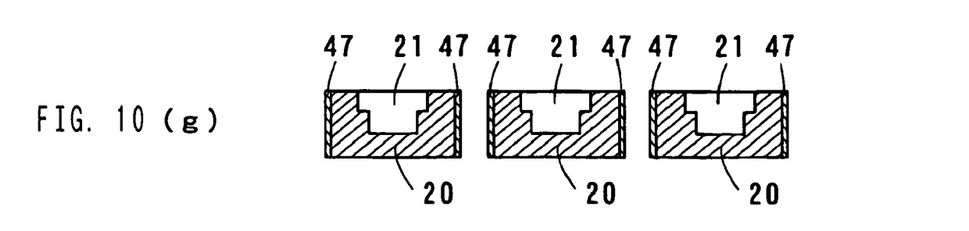

Next, as shown in FIG. 10(f), the green-sheet laminated body 26 is divided for each cavity 21 to obtain a plurality of green-sheet laminated body chips 27. Then, as shown in FIG. 10(g), each of the green-sheet laminated body chips 27 is fired to obtain the laminated ceramic substrate 20.

EXAMPLE 1

Figure 1A:
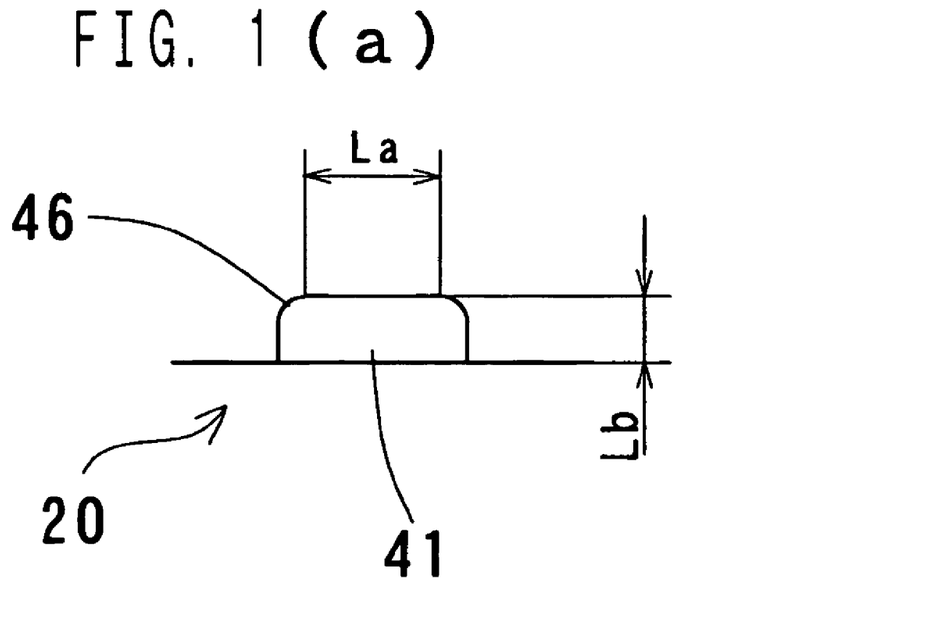
FIG. 1 includes a partial top view and a partial perspective view according to Example 1 of the present invention.
Figure 1B:
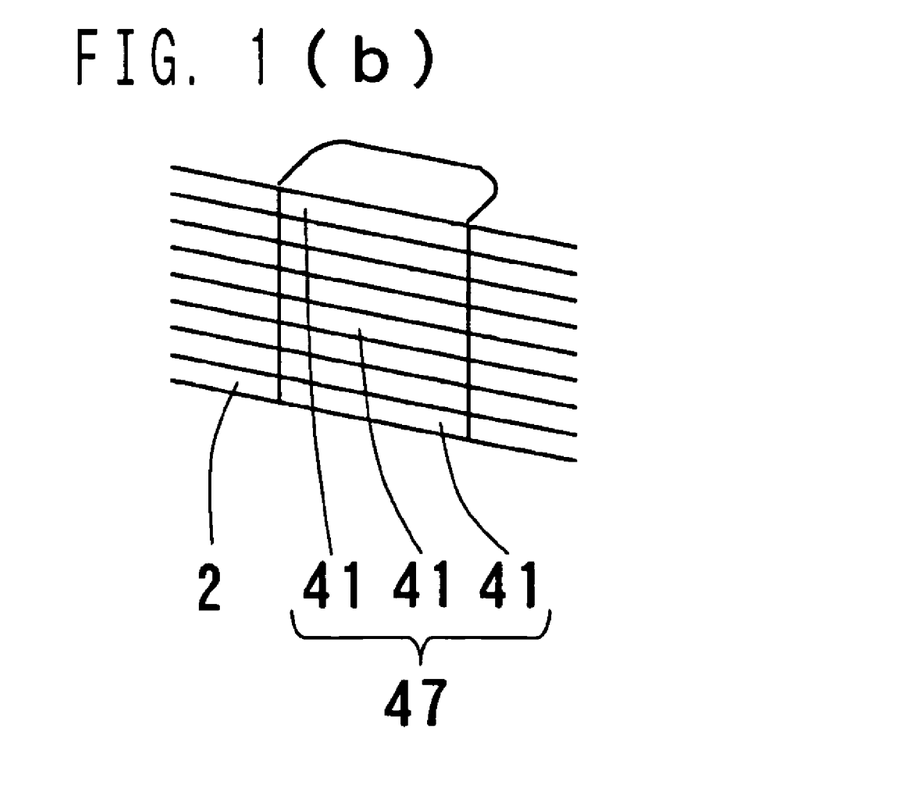

FIG. 1(a) is a partial top view in the vicinity of a side electrode of a laminated ceramic substrate according to the present invention. FIG. 1(b) is a partial perspective view in the vicinity of the side electrode of the ceramic substrate. Provided on a side surface of the laminated ceramic substrate 20 is a side electrode 47 in which side edge electrode layers 41 overlap and connect from the top layer to the bottom layer. The side edge electrode layer includes a parallel wall unexposed and approximately parallel to the side surface of the laminated ceramic substrate and a perpendicular wall approximately perpendicular to the side surface of the laminated ceramic substrate. A length La of the parallel wall and a depth Lb of the parallel wall from the side surface of the laminated ceramic substrate have a relationship of La>Lb.

Furthermore, the parallel wall and perpendicular wall are connected by a corner portion 46 with an R-shape. Failure to provide the R-shape may easily cause a shortage of a conductive material 24 because the corner portion 46 without the R-shape is difficult to fill with the conductive material 24. This may decrease a contact area after firing between a conductive material side wall and ceramic side wall of the side electrode 47 of the laminated ceramic substrate 20, resulting in low peel strength of the side electrode 47 against the ceramic part. Moreover, an attempt to completely fill the corner portion 46 with the conductive material 24 may complicate the management of the filling step to lower the productivity. Therefore, preferably, the corner portion 46 has an R-shape like the present example. The range of R is sufficient if greater than 0.02 mm.

EXAMPLE 2

Figure 2A:
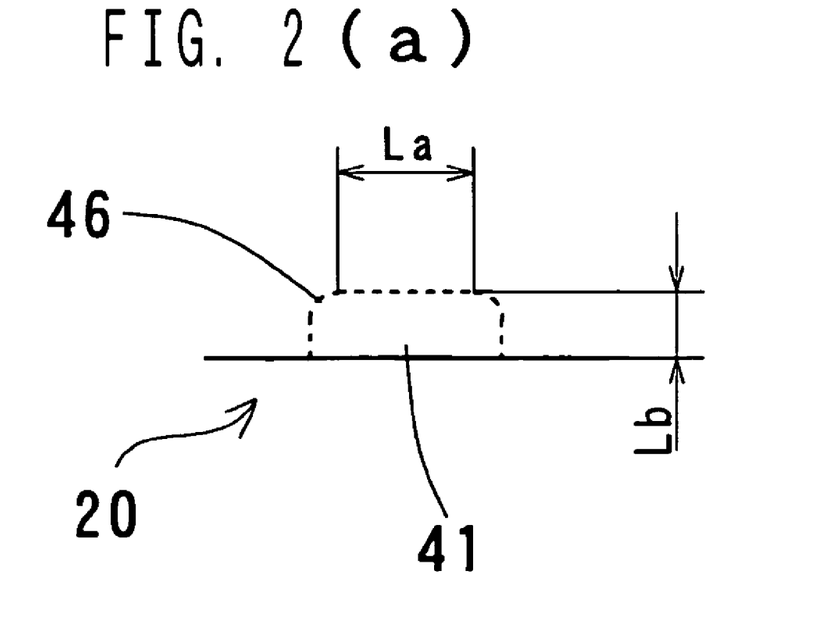
FIG. 2 includes a partial top view and a partial perspective view according to Example 2 of the present invention.
Figure 2B:
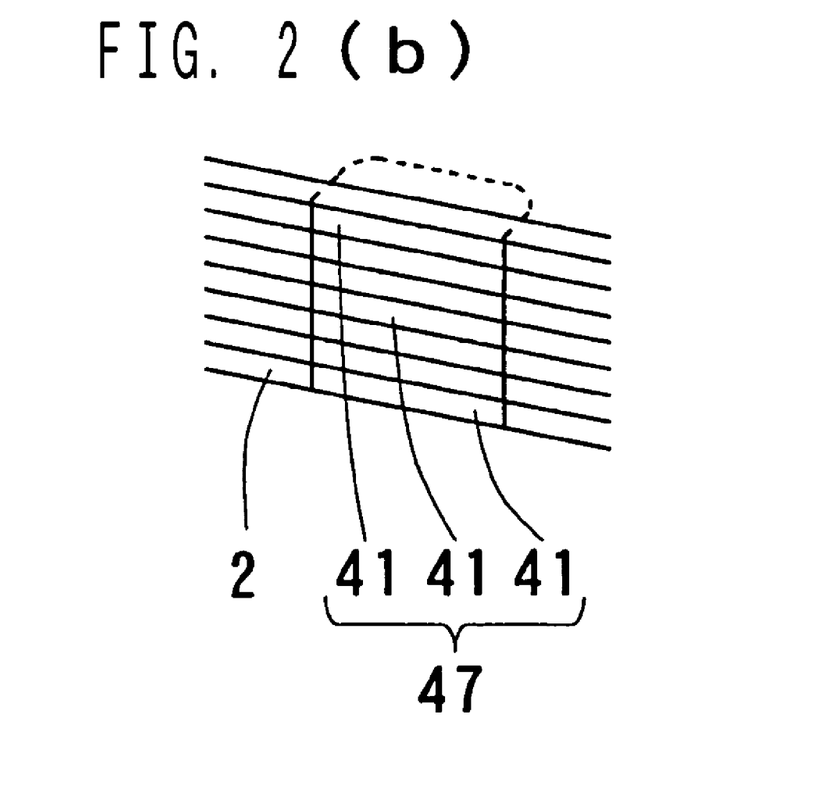

FIG. 2(a) is a partial top view in the vicinity of a side electrode of a laminated ceramic substrate according to a second example of the present invention. FIG. 2(b) is a partial perspective view in the vicinity of the side electrode of the ceramic substrate. In the side electrode on a side surface of the laminated ceramic substrate 20, the top layer fails to have a side edge electrode layer, but each layer from the second top layer to the bottom layer has a side edge electrode layer. The present example shows the top layer without a side edge electrode layer, but a layer without a side edge electrode layer is not limited to the top layer and may be another layer or a plurality of layers.

In the present examples, the green-sheet laminated body 26 is divided and thereafter fired, but the same effect can of course be obtained even if the green-sheet laminated body 26 is fired and thereafter divided. Furthermore, the filling of the through hole for a via hole and the through hole 23 for a side electrode with the conductive material 24 may be performed simultaneously with the printing of the circuit element pattern 30 on the surface of the green sheet 25 with the conductive material 24.

Embodiments of the present invention are described above specifically with examples, but the present invention is not limited to these examples.

INDUSTRIAL APPLICABILITY

The present invention can decrease an occurrence rate of disconnections of a side electrode caused by lamination shift, and therefore can decrease disconnection defects of a laminated ceramic substrate to improve production yield of the laminated ceramic substrate.

The invention claimed is:

1. A laminated ceramic substrate formed by laminating a plurality of ceramic layers, the laminated ceramic substrate including a side electrode comprising a side edge electrode layer formed on a side edge portion of at least one of the ceramic layers which overlaps with and connects to a side edge electrode layer formed on a side edge portion of an adjacent ceramic layer directly above and/or directly below the at least one ceramic layer, each side edge electrode layer being within a through hole in the ceramic substrate, the through hole defined by a side surface of the laminated ceramic substrate, a wall approximately parallel to the side surface of the laminated ceramic substrate and two perpendicular walls approximately perpendicular to the side surface of the laminated ceramic substrate, a length La of the parallel wall and a depth Lb of the parallel wall from the side surface of the laminated ceramic substrate having a relationship of La>Lb.

2. A laminated ceramic substrate according to claim 1, wherein each perpendicular wall is connected to the parallel wall by a corner portion with a circular-arc shape of a radius R in which R is greater than 0.02 mm.

3. A laminated ceramic substrate formed by laminating a plurality of ceramic layers, the laminated ceramic substrate including opposite side electrodes each comprising a side edge electrode layer formed on a side edge portion of at least one of ceramic layers which overlaps with and connects to a side edge electrode layer formed on a side edge portion of an adjacent ceramic layer directly above and/or directly below the at least one ceramic layer, each side edge electrode layer being within a through hole in the ceramic substrate, the through hole defined by a side surface of the laminated ceramic substrate, a wall approximately parallel to the side surface of the laminated ceramic substrate and two perpendicular walls approximately perpendicular to the side surface of the laminated ceramic substrate, a length La of the parallel wall and a depth Lb of the parallel wall from the side surface of the laminated ceramic substrate having a relationship of La>Lb.

4. A laminated ceramic substrate according to claim 3, wherein each perpendicular wall is connected to the parallel wall by a corner portion with a circular-arc shape of a radius R in which R is greater than 0.02 mm.

5. A laminated ceramic substrate according to claim 3, wherein the amount of the depths (LbL+LbR) of opposite side edge electrode layers on at least one ceramic layer differs from the amount of the depths (LbL+LbR) of opposite side edge electrode layers on the other ceramic layers.

6. A laminated ceramic substrate according to claim 4, wherein the amount of the depths (LbL+LbR) of opposite side edge electrode layers on at least one ceramic layer differs from the amount of the depths (LbL+LbR) of opposite side edge electrode layers on the other ceramic layers.

* * * * *